United States Patent [19]
Aiso et al.

[11] Patent Number: 5,959,326
[45] Date of Patent: Sep. 28, 1999

[54] CAPACITOR INCORPORATED IN SEMICONDUCTOR DEVICE HAVING A LOWER ELECTRODE COMPOSED OF MULTI-LAYERS OR OF GRADED IMPURITY CONCENTRATION

[75] Inventors: Fumiki Aiso; Hirohito Watanabe; Toshiyuki Hirota; Masanobu Zenke; Shuji Fujiwara, all of Tokyo, Japan

[73] Assignee: NEC Corporation, Tokyo, Japan

[21] Appl. No.: 08/852,530

[22] Filed: May 7, 1997

[30]     Foreign Application Priority Data

May 8, 1996   [JP]   Japan ..................................... 8-113342

[51] Int. Cl.$^6$ ...................................................... H01G 4/06
[52] U.S. Cl. .......................... 257/306; 257/296; 257/298; 257/300; 257/301; 257/302; 257/303; 257/304; 257/305; 257/306; 257/309
[58] Field of Search ................................... 257/296, 298, 257/300, 301–305, 306, 309

[56]                References Cited

U.S. PATENT DOCUMENTS

| 5,134,086 | 7/1992 | Ahn . |
| 5,138,411 | 8/1992 | Sandhu ..................................... 257/309 |
| 5,227,651 | 7/1993 | Kim et al. ................................ 257/309 |
| 5,348,894 | 9/1994 | Gnade et al. ............................ 361/305 |
| 5,385,863 | 1/1995 | Tatsumi et al. . |
| 5,418,180 | 5/1995 | Brown . |
| 5,463,235 | 10/1995 | Ishii ....................................... 257/306 |
| 5,656,531 | 8/1997 | Thakur et al. . |

FOREIGN PATENT DOCUMENTS

| 0 553 791 A2 | 8/1993 | European Pat. Off. . |
| 0 630 055 A2 | 12/1994 | European Pat. Off. . |
| 5-110023 | 4/1993 | Japan . |
| 5-304273 | 11/1993 | Japan . |
| 7-14797 | 1/1995 | Japan . |
| 2313231 | 11/1997 | United Kingdom . |

OTHER PUBLICATIONS

British Search Report, dated Jul. 15, 1997.
European Search Report.

*Primary Examiner*—Fetsum Abraham
*Attorney, Agent, or Firm*—Whitham, Curtis & Whitham

[57]                ABSTRACT

In a capacitor incorporated in a semiconductor device, a capacitor lower plate is formed of a first amorphous silicon film on an interlayer insulator film and a second amorphous silicon film stacked on the first amorphous silicon film. A crystallization preventing film is formed between the first and second amorphous silicon films, or alternatively, the first amorphous silicon film is formed to have an impurity concentration lower than that of the second amorphous silicon film. A stacked structure formed of the first and second amorphous silicon films is patterned into a capacitor lower plate having a top surface and a side surface, and hemispherical grains are formed on not only the top surface but also the side surface of the patterned stacked structure. In this process, crystalline growth from the interlayer insulator film is prevented by the crystallization preventing film or by the fact that the first amorphous silicon film is formed to have an impurity concentration lower than that of the second amorphous silicon film. Thus, concaves and convexes in the form of hemispherical grains are uniformly formed on not only the top surface but also the side surface of the patterned stacked structure, so that a remarkably increased capacitance can be obtained.

9 Claims, 5 Drawing Sheets

CAPACITOR INCORPORATED IN SEMICONDUCTOR DEVICE HAVING A LOWER ELECTRODE COMPOSED OF MULTI-LAYERS OR OF GRADED IMPURITY CONCENTRATION

BACKGROUND OF THE INVENTION

1. Field of the Invention

The present invention relates to a semiconductor device, and more specifically to a capacitor incorporated in a semiconductor device and a method for forming the same.

2. Description of Related Art

At present, as can be seen in a DRAM (dynamic random access memory), a high integration density is demanded in semiconductor devices. In order to fulfil this demand, an area required fro each memory cell in the DRAM has been extremely reduced. For example, in a 1 MDRAM or 4 MDRAM, a 0.8 $\mu$m rule has been adopted in the semiconductor device design, and further, in a 16 MDRAM, a 0.6 $\mu$m rule has been adopted.

As mentioned above, the integration density is increased more and more, namely, a memory capacity is increased more and more in a semiconductor memory. However, in order to elevate the production efficiency and to lower a production cost, it is not allowed to increase the size of a semiconductor device chip. Because of this, how small a memory cell is formed, is an important problem to be solved in the semiconductor device.

However, if the area of the memory cell is reduced, the amount of electric charges stored in the memory cell correspondingly become small.

Therefore, it has become difficult to realize a high integration density of memory cells and at the same time to ensure a necessary amount of electric charge stored in each memory cell.

Under the above mentioned circumstance, a memory cell having a trench capacitor and a memory cell having a stacked capacitor have been proposed and reduced in practice.

As compared with the memory cell having the trench capacitor, the memory cell having the stacked capacitor has an excellent soft-error resistance and an advantage in which no damage is given to a silicon substrate. Therefore, the stacked capacitor type memory cell is expected as a next generation memory cell structure.

As the stacked capacitor, there is proposed a stacked capacitor formed by utilizing a HSG (hemi-spherical (silicon crystalline) grain) technique (See for example Japanese Patent Application Pre-examination Publication No. JP-A-5-110023, an English abstract of which is available from the Japanese Patent Office and is incorporated by reference in its entirety into this application). The stacked capacitor proposed by JP-A-5-110023 is constituted of a capacitor lower plate, a capacitor insulator film and a capacitor upper plate, the capacitor lower plate being electrically connected through a contact hole formed in an interlayer insulator film, to a MOSFET (metal-oxide-semiconductor field effect transistor) formed in a semiconductor substrate.

Here, the HSG technique is to form a number of hemi-spherical grains on a surface of a storage electrode (capacitor lower plate), so that a surface area of the storage electrode is substantially increased, with the result that an increased capacitance is realized.

In order to form the storage electrode having the surface covered with the hemi-spherical grains mentioned above, various processes were proposed. For example, JP-A-5-110023 proposes to deposit a voidless polysilicon film or an amorphous silicon film by a LPCVD (low pressure chemical vapor deposition) process as an underlying film of a capacitor lower plate, then to form a natural oxide film on the underlying film, and to deposit another amorphous silicon film on the natural oxide film by a LPCVD process, as an overlying film of the capacitor lower plate, and further to conduct a heat treatment to the overlying amorphous silicon film, so that a surface-roughed polysilicon film having a concavo-convex upper surface is formed.

In this process, when the overlying amorphous silicon film is heat-treated, migration occurs in the amorphous silicon film, so that crystalline grains are formed, with the result that the surface-roughed polysilicon film having the concavo-convex upper surface is formed. In addition, in this process, since crystallinity of the underlying silicon film is prevented from giving any influence to the overlying roughed polysilicon film by the natural oxide film, it is possible to sufficiently roughen the overlying silicon film surface.

Furthermore, Japanese Patent Application Pre-examination Publication No. JP-A-7-014797 (which was a publication of Japanese Patent Application No. 140710/1994 filed claiming Convention Priority based on U.S. patent application Ser. No. 08/071904 filed on Jun. 3, 1993, a disclosure of which is incorporated by reference in its entirety into this application), proposes another method for forming a polysilicon layer having a concavo-convex surface. In this method, in order to prevent generation of a dopant defective region occurring when there is used a high temperature dopant migration method for causing, by means of a heat treatment, the dopant to move upward from a layer underlying under a surface-roughened polysilicon layer, a silicon dioxide layer is formed on a polysilicon layer, and a silicon layer is formed on the silicon dioxide layer while being exposed to a dopant gas, with the result that a polysilicon layer having a concavo-convex surface is formed.

Both of JP-A-5-110023 and JP-A-7-014797 as mentioned above are characterized by enlarging the concaves and convexes formed on a top surface of a capacitor lower plate, but pay no attention to formation of concaves and convexes on a side surface of the capacitor lower plate. Because, in order to increase the capacitance of the memory cell capacitor, it is necessary to form the concaves and convexes not only on the top surface of the capacitor lower plate but also on the side surface of the capacitor lower plate which is exposed when the capacitor lower plate is patterned and which is therefore covered with a capacitor upper plate. Therefore, when the methods of JP-A-5-110023 and JP-A-7-014797 are applied for forming a capacitor on an actual MOSFET, a sufficient capacitance cannot be obtained.

Furthermore, neither JP-A-5-110023 nor JP-A-7-014797 discusses a phenomenon occurring at a boundary between an interlayer insulator film and a capacitor lower plate when the capacitor is connected to a MOSFET formed in the semiconductor device.

Furthermore, Japanese Patent Application Pre-examination Publication No. JP-A-5-304273 (which corresponds to U.S. Pat. No. 5,385,863, a disclosure of which is incorporated by reference in its entirety into this application), suggests to form the concaves and convexes on a side surface of a capacitor lower plate by utilizing the HSG technique called a "crystal nucleation". In this crystal nucleation, silicon atoms in the top surface and the side surface of an amorphous silicon film are caused to migrate, with the result that the concaves and convexes are formed on the top surface and the side surface.

However, when the capacitor lower plate is formed in accordance with this crystal nucleation, crystallization of the film starts from a boundary between the capacitor lower plate film and the interlayer insulator film, and this crystallization reaches to the top surface and the side surface before the silicon atoms in the top surface and the side surface are sufficiently migrated. If crystallization reaches to the top surface and the side surface, migration of silicon atoms can no longer occur, and therefore, the concaves and convexes can no longer be formed on the top surface and the side surface. As a result, it is not possible to form the concaves and convexes over the whole surface of the capacitor lower plate, and it is also not possible to avoid generation of defective regions of about 10% to 20%

SUMMARY OF THE INVENTION

Accordingly, it is an object of the present invention to provide a capacitor which is incorporated in a semiconductor device and which has overcome the above mentioned defects of the conventional ones.

Another object of the present invention is to provide a capacitor which is incorporated in a semiconductor device and which has uniform concaves and convexes on both a top surface and a side surface of a capacitor lower plate, thereby to have an increased large capacitance.

Still another object of the present invention is to provide a capacitor which is incorporated in a semiconductor device and which is formed in contact with an interlayer insulator film, but is not subjected to influence of crystallization from the interlayer insulator film.

A further object of the present invention is to provide a method for forming a capacitor incorporated in a semiconductor device, capable of uniformly forming concaves and convexes on both a top surface and a side surface of a capacitor lower plate, thereby to manufacture the capacitor having an increased large capacitance.

Still further object of the present invention is to provide a method for forming a capacitor having a capacitor lower plate in contact with an interlayer insulator film in a semiconductor device, while preventing crystallization generating from a boundary between the interlayer insulator film and the capacitor lower plate.

The above and other objects of the present invention are achieved in accordance with the present invention by a capacitor incorporated in a semiconductor device and having a capacitor lower plate having a top surface and a side surface continuous to the top surface, the capacitor lower plate being composed of a first silicon film, a crystallization preventing layer formed on the first silicon film, and a second silicon film formed on the crystallization preventing layer, the capacitor lower plate having concaves and convexes in the form of heri-spherical grains formed on the top surface and the side surface, the capacitor lower plate being covered with a capacitor insulating film, which is covered with a capacitor upper plate.

According to a second aspect of the present invention, there is provided a capacitor incorporated in a semiconductor device and having a capacitor lower plate having a top surface region and connected to another circuit element formed in the semiconductor device, the capacitor lower plate having an impurity concentration grade which is low at a lower portion adjacent to the circuit element and which is high at the top surface region, the capacitor lower plate having concaves and convexes in the form of hemi-spherical grains formed on at least the top surface, the capacitor lower plate being covered with a capacitor insulating film, which is covered with a capacitor upper plate.

According to a third aspect of the present invention, there is provided a method for forming a capacitor incorporated in a semiconductor device, the capacitor lower plate being in contact with an interlayer insulator film, the method including the steps of:

forming a first amorphous silicon layer on the interlayer insulator film;

forming on the first amorphous silicon layer a crystallization preventing film having a thickness smaller than that of the first amorphous silicon layer;

forming a second, impurity-containing, amorphous silicon layer on the crystallization preventing film;

patterning a stacked structure composed of the first and second amorphous silicon layers and the crystallization preventing film, into a capacitor lower plate having a predetermined shape;

heat-treating the capacitor lower plate so as to form concaves and convexes in the form of hemi-spherical grains on a surface of the capacitor lower plate, the crystallization preventing film preventing advancement of crystallization starting at a boundary between the interlayer insulator and the first amorphous silicon layer of the capacitor lower plate;

forming a capacitor insulator film to cover the capacitor lower plate; and forming a capacitor upper plate to cover the capacitor insulator film.

According to a fourth aspect of the present invention, there is provided a method for forming a capacitor incorporated in a semiconductor device, the capacitor lower plate being in contact with an interlayer insulator film, the method including the steps of:

forming a first amorphous silicon layer on the interlayer insulator film;

forming on the first amorphous silicon layer a second, impurity-containing, amorphous silicon layer having an impurity concentration higher than that of the first amorphous silicon layer;

patterning a stacked structure composed of the first and second amorphous silicon layers, into a capacitor lower plate having a predetermined shape;

heat-treating the capacitor lower plate so as to form concaves and convexes in the form of hemi-spherical grains on a surface of the capacitor lower plate, the first amorphous silicon layer having such a impurity concentration as to prevent advancement of crystallization starting at a boundary between the interlayer insulator and the first amorphous silicon layer of the capacitor lower plate;

forming a capacitor insulator film to cover the capacitor lower plate; and forming a capacitor upper plate to cover the capacitor insulator film.

The above and other objects, features and advantages of the present invention will be apparent from the following description of preferred embodiments of the invention with reference to the accompanying drawings.

DESCRIPTION OF THE PREFERRED EMBODIMENTS

Referring to FIGS. 1 to 7, a first embodiment of the method in accordance with the present invention for forming a first embodiment of the capacitor in accordance with the present invention incorporated in a semiconductor device will be now described.

Figure 1:
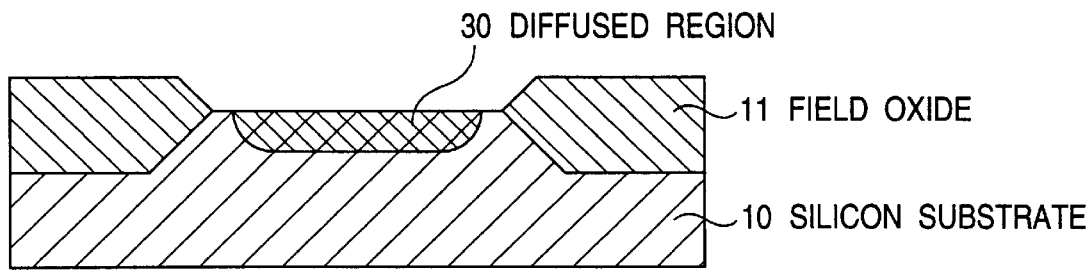
FIGS. 1 to 7 are diagrammatic sectional views of a part of semiconductor devices, for illustrating a first embodiment of the method in accordance with the present invention for forming a first embodiment of the capacitor in accordance with the present invention incorporated in a semiconductor device.

As shown in FIG. 1, an N-type silicon substrate 10 is prepared.

Various impurity diffused regions and various circuit elements, including MOSFETs (not shown), other than a capacitor element, are formed in and on the silicon substrate 10, and electrically connected to realize various functions. However, for representing those impurity diffused regions and various circuit elements, only an impurity diffused region 30 is shown for simplification of drawing.

Furthermore, on the silicon substrate 10, a silicon oxide film 11 having a thickness of 300 nm is selectively formed by a LOCOS (local oxidation of silicon) process, as a field oxide, namely, as a device isolation region. Therefore, the silicon substrate is partially exposed in a predetermined region, for example, a device formation region including the diffused region 30.

Figure 2:
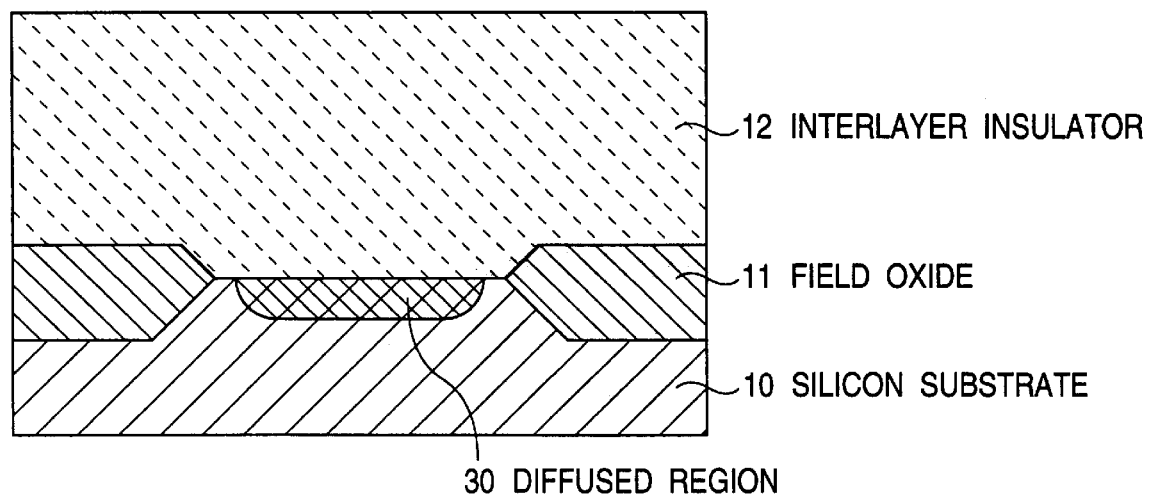

Then, as shown in FIG. 2, an interlayer insulator film 12 having a thickness of 600 nm formed of a silicon oxide or a BPSG (borophosphosilicate glass), is deposited to cover the silicon substrate 10 and the silicon oxide film 11, by an atmospheric pressure CVD process.

Figure 3:
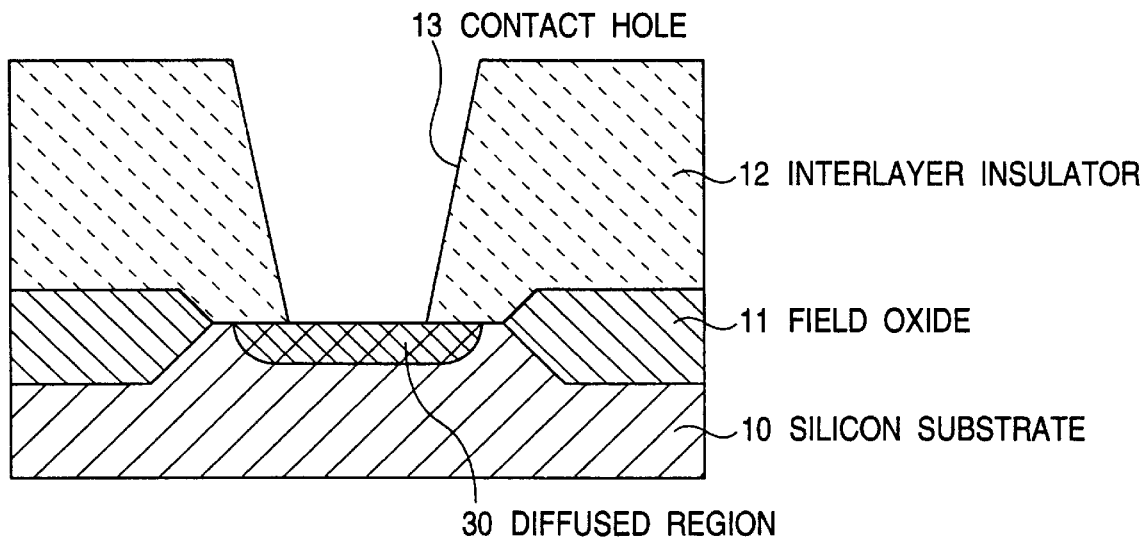

After the interlayer insulator film 12 is deposited, a contact hole 13 is formed to penetrate through the interlayer insulator film 12 at a predetermined position as shown in FIG. 3 by use of a dry etching or a wet etching. In the shown example, the contact hole 13 is formed to expose a surface of the diffused region 30 of the silicon substrate 10. For example, the contact hole 13 has an opening diameter of 400 nm and a bottom diameter of 200 nm.

After formation of the contact hole 13, the silicon substrate 10 having the silicon oxide film 11 and the interlayer insulator film 12 having the contact hole 13, is introduced into a reaction chamber for a CVD process, for the purpose of forming a capacitor lower plate in the reaction chamber.

Figure 4:
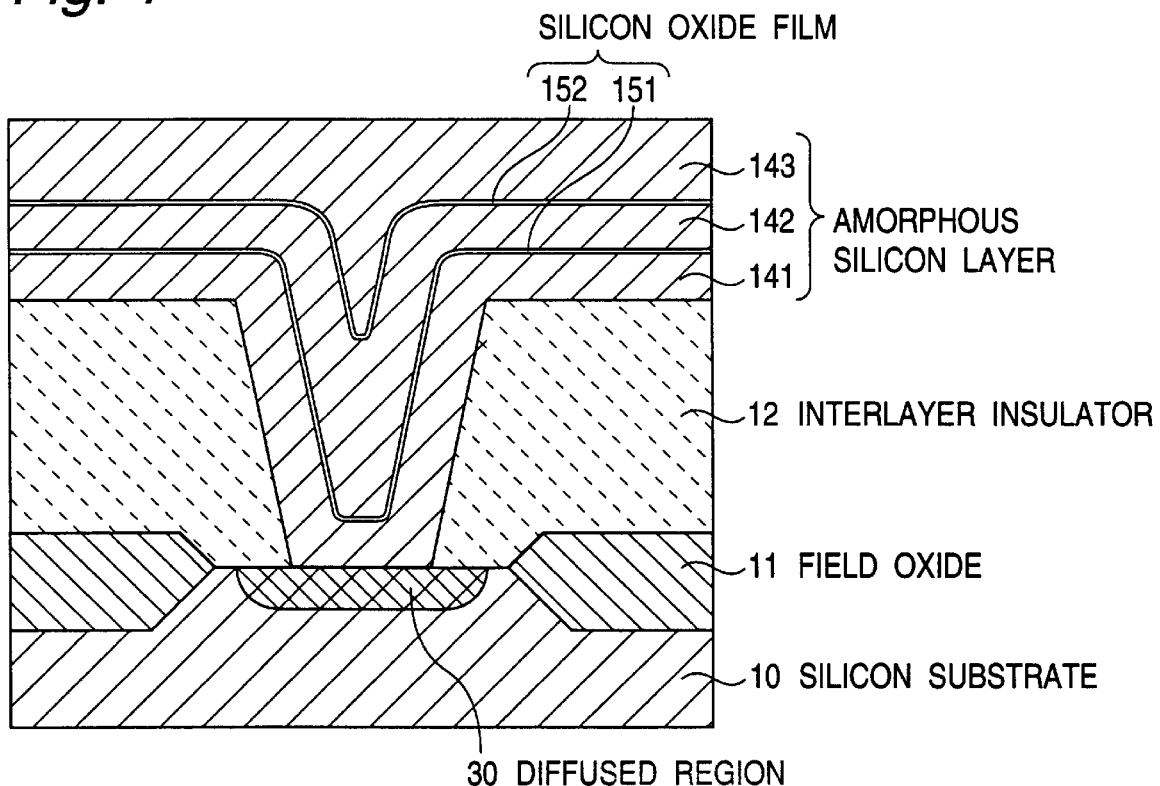

In the example shown in FIG. 4, first, second and third amorphous silicon films 141, 142 and 143 are deposited in the named order, and first and second silicon oxide films 151 and 152 are formed between the first and second amorphous silicon films 141 and 142 and between the second and third amorphous silicon films 142 and 143, respectively.

In the shown embodiment, in addition, each of first, second and third amorphous silicon films 141, 142 and 143 is formed of a phosphorus doped amorphous silicon.

First, the first amorphous silicon film 141 was formed by conducting a film deposition for about one hour under a film deposition condition of the silicon substrate temperature of 530° C., the reaction chamber pressure of $1.333 \times 10^2$ Pa (1.0 Torr), the SiH4 flow rate of 1000 cc/min, and the PH3 flow rate of 0.5 cc/min. Thus, the obtained first amorphous silicon film 141 is a phosphorus doped amorphous silicon film containing a phosphorus concentration of about $2 \times 10^{20}$ atom/cm$^3$ and having a thickness of 150 nm.

After formation of the first amorphous silicon film 141, supply of the SiH4 gas and the PH3 gas were stopped, and the reaction chamber was evacuated. Thereafter, a nitrogen gas containing 1% of oxygen was introduced into the reaction chamber at a flow rate of 1000 cc/min, for five minutes. As a result, a first silicon oxide film 151 having a thickness of 1 nm to 2 nm was formed on a surface of the first amorphous silicon film 141.

Succeedingly, under the same film deposition condition as that for forming the first amorphous silicon film 141, the second amorphous silicon film 142 was deposited. Therefore, the deposited second amorphous silicon film 142 is a phosphorus doped amorphous silicon film, similarly to the first amorphous silicon film 141.

Thereafter, the reaction chamber was evacuated, again. Thereafter, a nitrogen gas containing 1% of oxygen was introduced into the reaction chamber at a flow rate of 1000 cc/min, for five minutes, similarly to formation of the first silicon oxide film 151. Thus, a second silicon oxide film 152 having a thickness of 1 nm to 2 nm was formed on a surface of the second amorphous silicon film 142.

Then, the third amorphous silicon film 143 was formed by conducting the film deposition for about two hours under the same film deposition condition as those for forming the first and second amorphous silicon films 141 and 142. Thus, the third amorphous silicon film 143 having a thickness of about 300 nm was formed. Namely, the multilayer structure as shown in FIG. 4 can be obtained. Here, the third amorphous silicon film 143 is a phosphorus doped amorphous silicon film, similarly to the first and second amorphous silicon films 141 and 142.

In the above mentioned embodiment, the silicon oxide films 151 and 152 were formed in the same reaction chamber as that in which the first and second amorphous silicon films 141 and 142 were deposited.

However, the silicon oxide films 151 and 152 can be formed by taking out the silicon substrate from the chamber after each of the first and second amorphous silicon films 141 and 142 was deposited, so that the deposited amorphous silicon film is exposed to atmosphere, with the result that a natural oxide film is formed on a surface of the amorphous silicon film.

Here, the first amorphous silicon film 141 is in contact with the interlayer insulator film 12, and it was observed that when a heat treatment is conducted, a crystal grows from crystal nuclei on the interlayer insulator film 12. However, it was also observed that, when the crystal grown from the crystal nuclei on the interlayer insulator film 12 reaches the first silicon oxide film 151, the crystal does not grow further. Accordingly, in the multilayer structure shown in FIG. 4, the first and second silicon oxide films 151 and 152 functions as a crystallization preventing film. Incidentally, in the shown embodiment, two layers of crystallization preventing film composed of the first and second silicon oxide films 151 and 152 are provided, but a single layer of crystallization preventing film can be formed. In this case, the amorphous silicon films become two layers.

Figure 5:
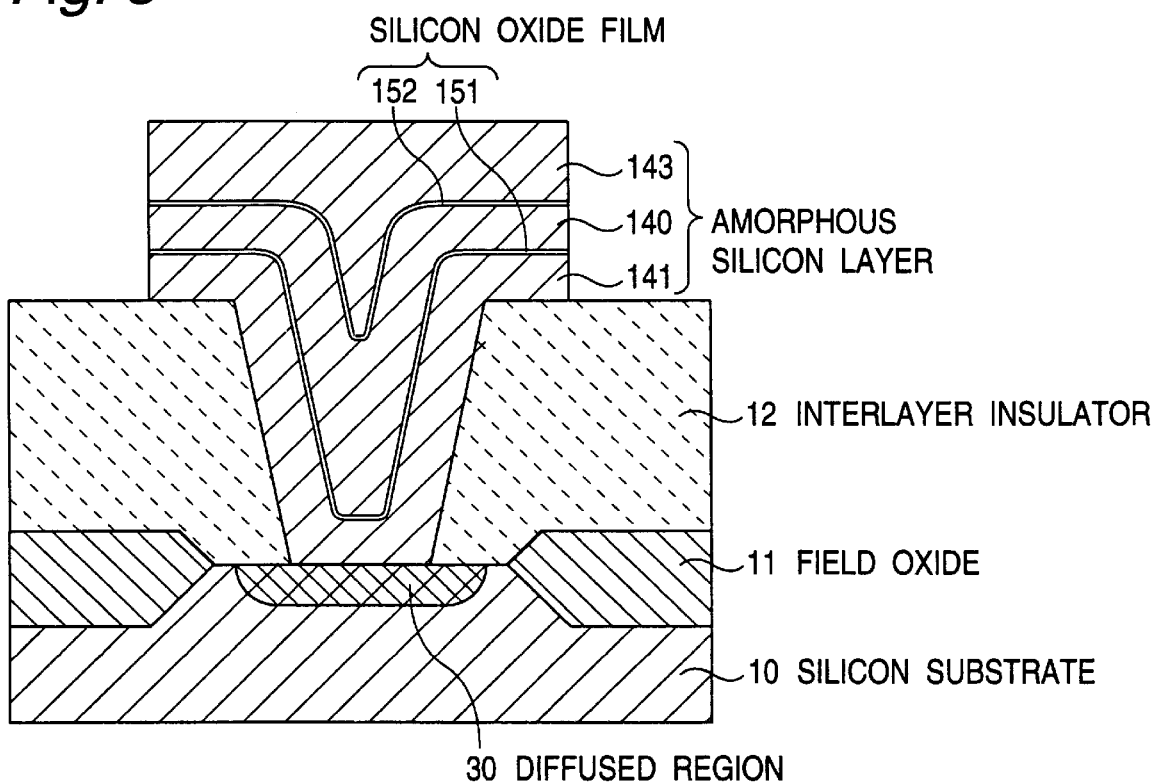

After the third amorphous silicon film 143 is formed as shown in FIG. 4, the multilayer structure composed of the amorphous silicon films 141, 142 and 143 and the silicon oxide films 151 and 152, is patterned by etching, to form a patterned multilayer structure (used as a capacitor lower plate) composed of the amorphous silicon films 141, 142 and 143 and the silicon oxide films 151 and 152, as shown in FIG. 5. This patterned stacked structure is exposed not only on a top surface but also on a side surface. In the as-patterned condition, the top surface and the side surface of the patterned multilayer structure are covered with a thin natural oxide film. This natural oxide film will become a hindrance to silicon atom migration required to form hemi-spherical grains in a succeeding process, which will be conducted for forming hemi-spherical grains on a surface of the patterned multilayer structure. This process will be called a "HSG process" hereinafter.

Accordingly, the natural oxide film on the top surface and the side surface of the patterned multilayer structure is removed by use of a dilute hydrofluoric acid or any other means. After the natural oxide film is removed, the HSG process is conducted in the reaction chamber.

In the HSG process, first, to form nuclei on the patterned multilayer structure, SiH4 was irradiated onto the patterned multilayer structure at the flow rate of about 20 cc/min within the reaction chamber maintained at a temperature of 560° C. under the pressure of 0.07998 Pa (0.6 mTorr).

Figure 6:
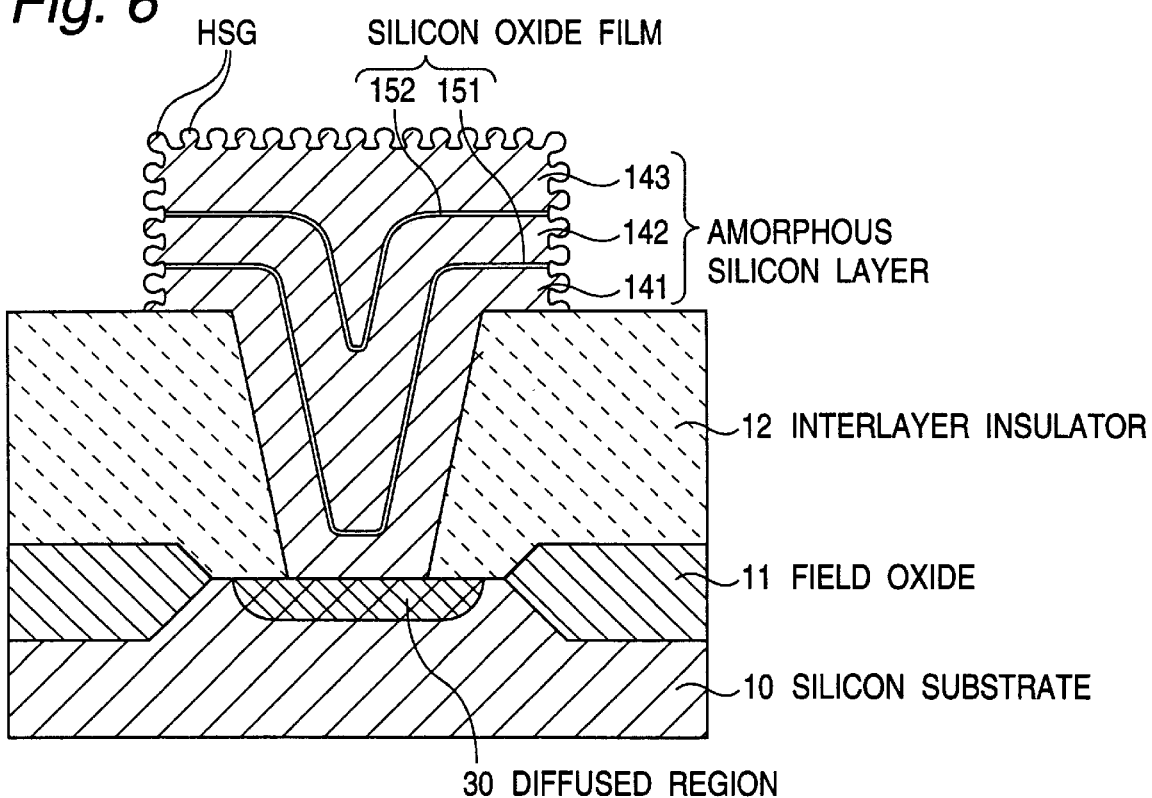

After the nuclei were formed on the top surface and the side surface of the patterned multilayer structure, the reaction chamber was evacuated to $1.333 \times 10^{-4}$ Pa ($1.0 \times 10^{-6}$ Torr), and then, a heat treatment was conducted at the same temperature of 560° for 40 minutes. As a result, as shown in FIG. 6, hemi-spherical grains HSG were formed not only on the top surface of the patterned multilayer structure but also on the side surface of the patterned multilayer structure.

Here, distribution of the hemi-spherical grains was extremely uniform on the top surface and the side surface of the patterned multilayer structure, because the crystalline growth from the crystal nuclei at the boundary between the interlayer insulator film 12 and the amorphous silicon layer is prevented by the first and second silicon oxide films 151 and 152. Thus, the patterned multilayer structure having the hemi-spherical grains formed on its whole surface, can be used as a capacitor lower plate. This capacitor lower plate had a surface area which is not less than 1.8 times, preferably, not less than two times, that of a plate which has no concave-convex surface given by the hemi-spherical grains HSG.

Figure 7:
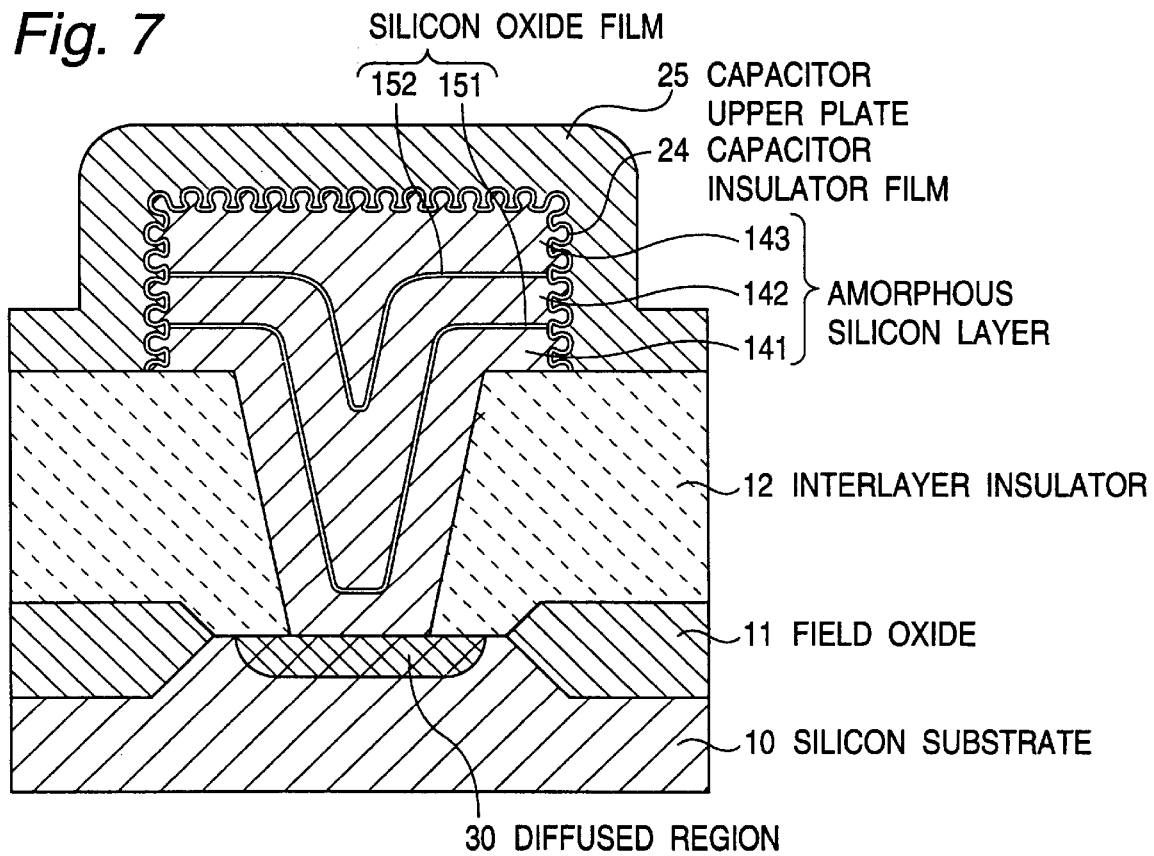

Thereafter, as shown in FIG. 7, in accordance with the LPCVD process under the condition of 650° C. and $0.9331 \times 10^2$ Pa (0.7 Torr), SiH2Cl2 was introduced at the flow rate of 40 cc/min and NH3 was introduced at the flow rate of 120 cc/min, for 20 minutes. Thus, a silicon nitride film 24 having a thickness of 7 nm was formed to cover the surface of the hemi-spherical grains HSG, as a capacitor insulator film, namely, as a capacitor dielectric film. Succeedingly, a phosphorus doped silicon film 25 having a thickness of 200 nm is formed to cover the capacitor insulator film 24, as a capacitor upper plate. Thus, a capacitor element is completed. Here, the silicon film 25 constituting the capacitor upper plate can be formed of amorphous silicon film or a polysilicon film.

In the first embodiment, each of the silicon oxide films 151 and 152 has a thickness of 1 nm to 2 nm, as mentioned above. Preferably, each of the silicon oxide films 151 and 152 has a thickness of not greater than 5 nm, in order that the amorphous silicon films 141, 142 and 143 are mutually electrically connected through the silicon oxide films 151 and 152 but a sufficient crystallization preventing function can be ensured.

Now, referring to FIGS. 8 and 9, a second embodiment of the method in accordance with the present invention for forming a second embodiment of the capacitor in accordance with the present invention incorporated in a semiconductor device, will be described.

The second embodiment is the same as the first embodiment, in the step as shown in FIG. 1 for forming the silicon oxide film 11 on the silicon substrate 10, in the step as shown in FIG. 2 for forming the interlayer insulator film 12 on the silicon substrate 10 and the silicon oxide film 11, in the step as shown in FIG. 3 for forming the contact hole in the interlayer insulator film 12, and also in tile HSG forming step as shown in FIG. 6 and in the step as shown in FIG. 7 for forming the capacitor insulator film and the capacitor upper plate. In other words, the second embodiment is different from the first embodiment only in the steps as shown in FIGS. 4 and 5 for forming the capacitor lower plate.

Figure 8:
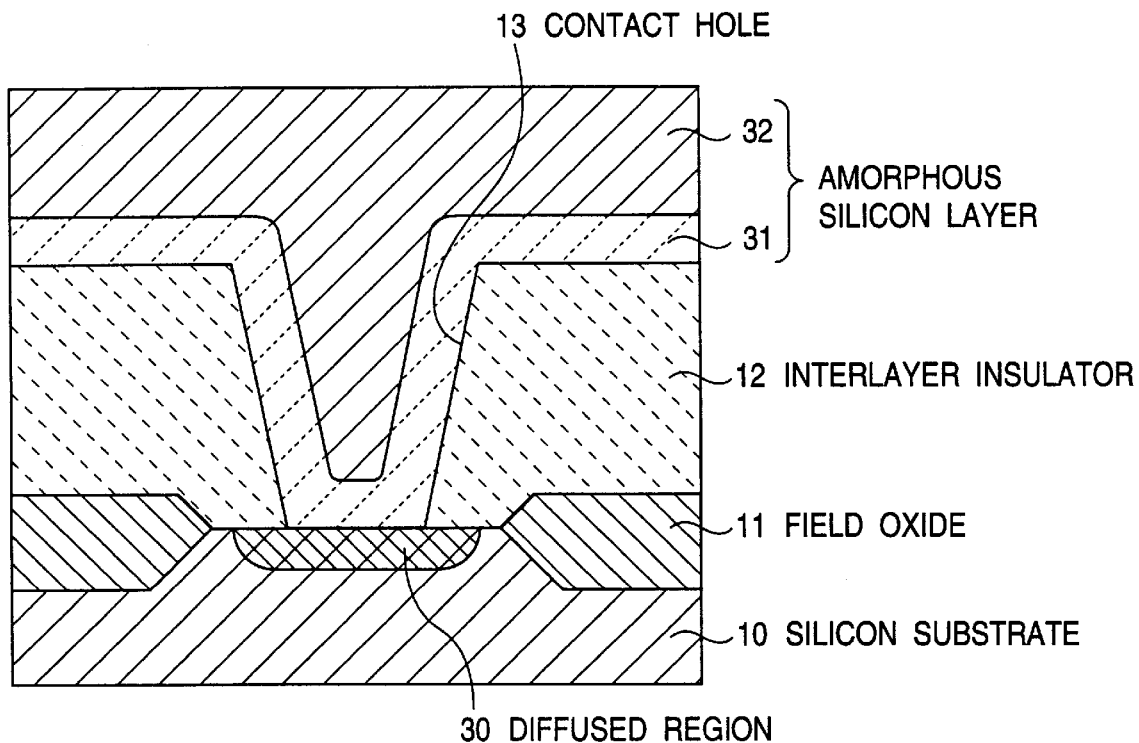
FIGS. 8 and 9 are views similar to those of FIGS. 4 and 5, but illustrating a second embodiment of the method in accordance with the present invention for forming a first embodiment of the capacitor in accordance with the present invention incorporated in a semiconductor device.
Figure 9:
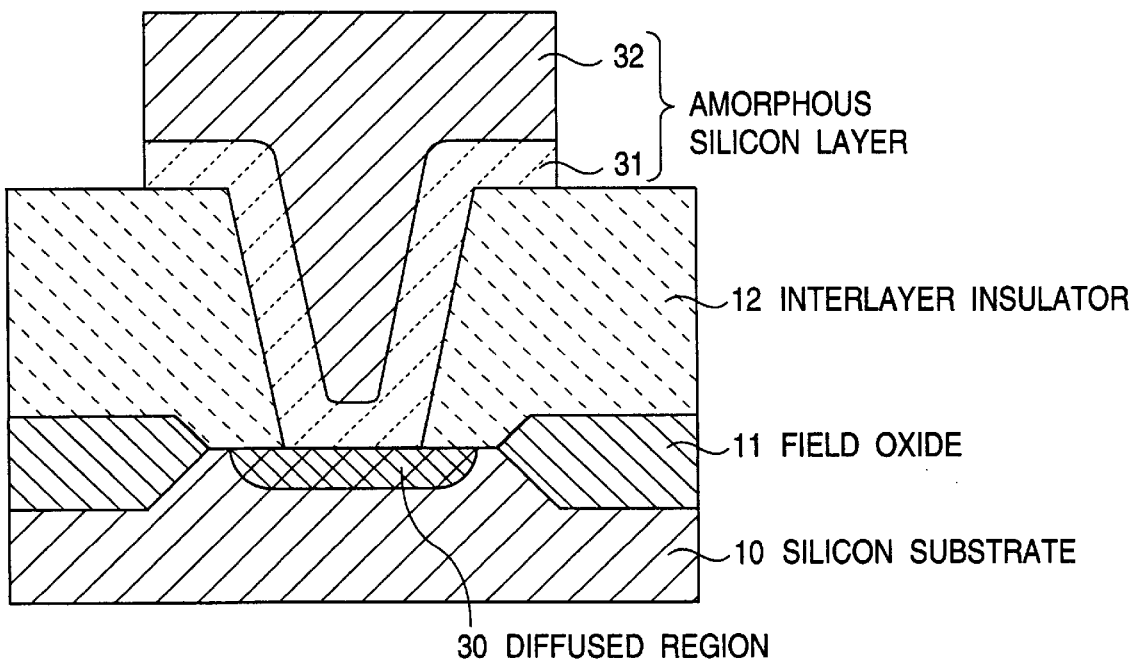

Therefore, FIGS. 8 and 9 illustrates only the steps for forming the capacitor lower plate, and in FIGS. 8 and 9, elements similar to those shown in FIGS. 1 to 7 are given the same Reference Numerals, and explanation thereof will be omitted for simplification of description.

Accordingly, only the steps for forming the capacitor lower plate in the second embodiment will be described with reference to FIGS. 8 and 9. As shown in FIG. 8, a first amorphous silicon film 31 having no doped impurity or a low concentration of impurity, is formed on the interlayer insulator film 12 and the diffused region 30 exposed in the contact hole, and a second amorphous silicon film 32 having a high concentration of impurity, is formed on the amorphous silicon film 31.

In the shown example, the first amorphous silicon film 31 was formed by conducting a film deposition for about 20 minutes under a film deposition condition of the silicon substrate temperature of 530° C., the reaction chamber pressure of $1.333 \times 10^2$ Pa (1.0 Torr), and the SiH4 flow rate of 1000 cc/min. Thus, the non-doped first amorphous silicon film 31 having a thickness of about 30 nm to 50 nm was formed.

On the other hand, when PH3 was introduced at the flow rate of 0.2 cc/min together with introduction of SiH4, an amorphous silicon film containing a low phosphorus concentration of not greater than $7 \times 10^{19}$ atom/cm$^3$ could be obtained. This means that the flow rate of PH3 introduced as impurity at the time of forming the first amorphous silicon film 31 is preferably adjusted in the range of 0 cc/min to 0.2 cc/min.

Succeedingly to formation of the first amorphous silicon film 31, the second amorphous silicon film 32 having the impurity concentration higher than that of the first amorphous silicon film 31 is formed. As the second amorphous silicon film 32, an amorphous silicon film containing a phosphorus concentration of $2-10^{20}$ atom/cm$^3$ was deposited to have a thickness of 550 nm by introducing PH3 at the flow rate of 0.5 cc/min together with introduction of SiH4.

The first and second deposited second amorphous silicon films 31 and 32 can be formed in the same reaction chamber by changing the flow rate of PH3 for the purpose of changing the impurity concentration of the deposited film. However, the first and second deposited second amorphous silicon films 31 and 32 can be formed in different reaction chambers which are set to different flow rates of PH3, respectively.

Furthermore, the first and second deposited second amorphous silicon films 31 and 32 can be formed in the same reaction chamber by continuously changing the flow rate of PH3 from 0 cc/min to 0.5 cc/min for the purpose of continuously changing the impurity concentration of the deposited film.

Furthermore, a crystallization preventing layer can be formed between the first and second deposited second amorphous silicon films 31 and 32 by utilizing the first embodiment in combination with the second embodiment.

Thereafter, the multilayer structure composed of the amorphous silicon films 31 and 32, is patterned by etching, to form a patterned multilayer structure (used as a capacitor lower plate), as shown in FIG. 9, which is electrically connected to the silicon substrate 10, more specifically to the diffused region 30 formed in the silicon substrate 10, and which is also in contact with the interlayer insulator film 12. This pattern stacked structure is exposed not only on a top surface but also on a side surface.

In this as-patterned condition, similarly to the step shown in FIG. 6, the HSG process was conducted in the top surface and the side surface of the patterned multilayer structure, so that a capacitor lower plate is constituted.

Succeedingly, similarly to the step shown in FIG. 7, a capacitor dielectric film 24 and a capacitor upper plate 25 are formed. Thus, a capacitor element is completed.

It was observed that the capacitor element thus formed, has concaves and convexes in the form of hemi-spherical grains HSG on the top surface and the side surface of the capacitor lower plate, and the concaves and convexes were extremely uniformly distributed, because the crystalline growth does not occur from the crystal nuclei at the boundary between the interlayer insulator film 12 and the amorphous silicon layer.

In this connection, it was confirmed from experiments that, if the phosphorous concentration of the first amorphous silicon film 31 in contact with the interlayer insulator 12 is not greater than $7 \times 10^{19}$ atom/cm$^3$, crystal does not grow from the crystal nuclei at the interlayer insulator film 12. It was also found that, if the second amorphous silicon film 32 was formed of an amorphous silicon having a low concentration of impurity, a depletion layer extends from the capacitor lower plate surface, and when a positive bias is applied to the capacitor upper plate, the capacitance value drops 40% or more.

Therefore, when the capacitor lower plate surface is formed of only an amorphous silicon having a low concentration of impurity, the increase of the capacitance obtained by the HSG processing of the capacitor lower plate will be substantially cancelled.

On the other hand, if the capacitor lower plate surface is formed of only an amorphous silicon having a high concentration of impurity of greater than $7 \times 10^{19}$ atom/cm$^3$ (for example, $2 \times 10^{20}$ atom/cm$^3$), the crystalline growth from the crystal nuclei at the interlayer insulator film 12 in the HSG process reaches a surface to be formed with the hemi-spherical grains HSG, with the result that distribution of hemi-spherical grains HSG becomes uneven.

The second embodiment shown in FIGS. 8 and 9 has such features that the impurity concentration of the first amorphous silicon film 31 in contact with the interlayer insulator film 12 is low enough to prevent the crystalline growth from the interlayer insulator film, and on the other hand, the second amorphous silicon film 32 to be formed with the hemi-spherical grains HSG has a high impurity concentration sufficient to realize an increase of capacitance by the formation of hemi-spherical grains HSG and simultaneously to prevent generation of a depletion layer.

The shown second embodiment was formed to have the stacked structure of the first amorphous silicon layer having the low concentration of impurity and the second amorphous silicon layer having the high concentration of impurity. However, three or more amorphous silicon layers having different concentrations of impurity can be stacked, or alternatively, the stacked structure can be replaced by a single amorphous silicon layer having the impurity concentration grade which continuously increases from a portion near to the interlayer insulator film. In either of these cases, a plurality of stacked amorphous silicon layers having having different concentrations of impurity are formed or equivalently formed, similarly to the embodiment shown in FIGS. 8 and 9.

Considering various impurities, in order to prevent crystalline growth from the crystal nuclei at the interlayer insulator film 12, the impurity concentration of the first amorphous silicon film 31 in contact with the interlayer insulator 12 is preferred to be less than $1 \times 10^{20}$ atom/cm$^3$, and in order to prevent the depletion layer, the impurity concentration of the second amorphous silicon film 32 is preferred to be greater than $1 \times 10^{20}$ atom/cm$^3$.

Figure 10:
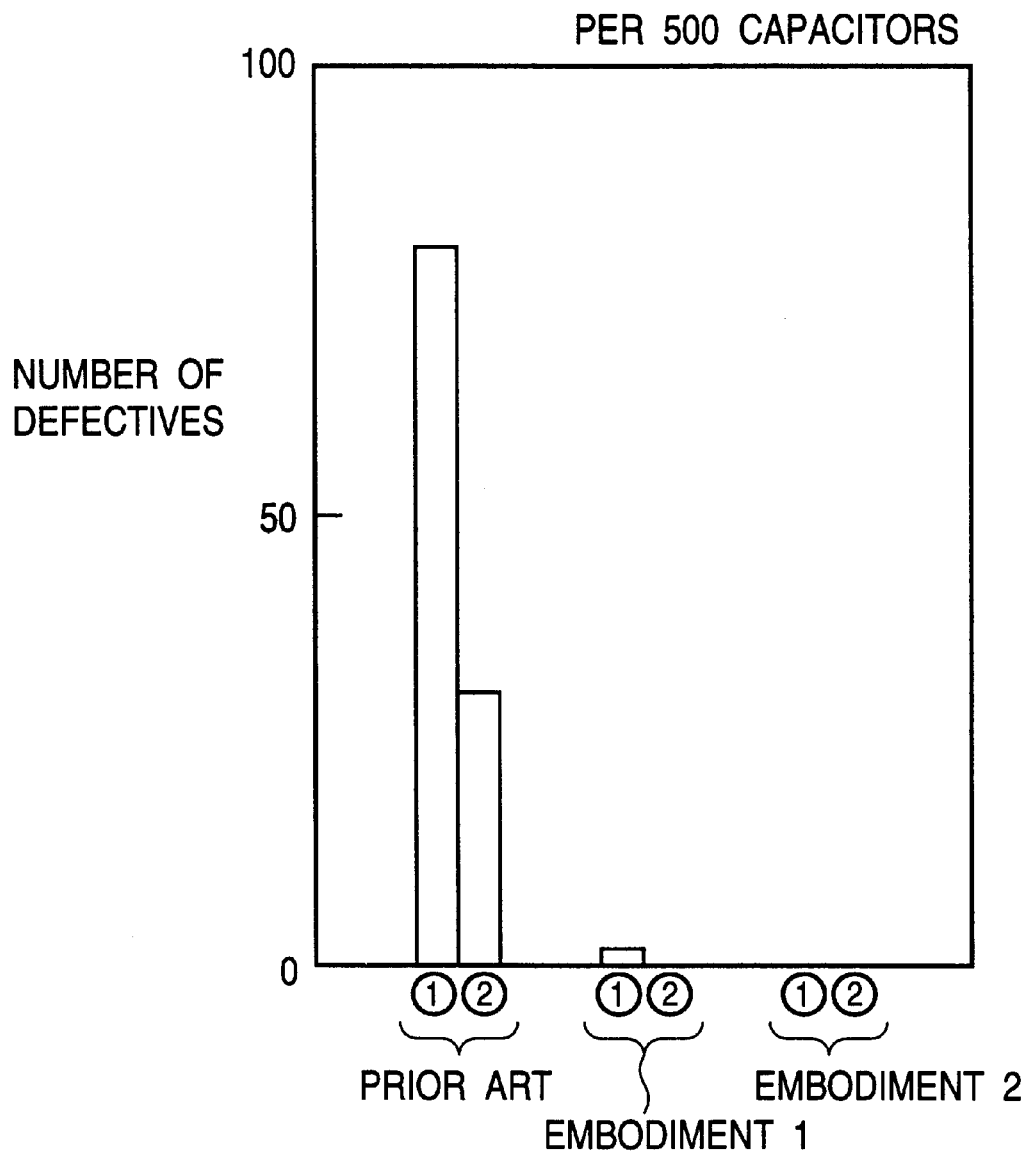
FIG. 10 is a graph illustrating a fraction defective of capacitors manufactured in accordance with the prior art method and the two embodiments of the capacitor in accordance with the present invention.

Referring to FIG. 10, there is shown a graph illustrating a fraction defective of capacitors manufactured in accordance with the prior art method and the two embodiments of the capacitors in accordance with the present invention. The prior art example was a capacitor having a capacitor lower plate which is formed of a single layer of amorphous silicon film and which has a top surface and a side surface both processed by the HSG process to have concaves and convexes in the form of hemi-spherical grains HSG. In addition, the capacitance of the capacitor which is not subjected to the HSG process is standardized to "1", and HSG-processed capacitors having the capacitance magnification of less than 1.2 are classified to "case ②", and HSG-processed capacitors having the capacitance magnification of not less than 1.2 but less than 1.8 are classified to "case ①".

As seen from the graph of FIG. 10, 500 capacitors manufactured in accordance with the prior art include 80 capacitors including a portion which has no concave/convex in the form of hemi-spherical grains HSG, and 30 capacitors including no concave/convex in the form of hemi-spherical grains HSG.

On the other hand, the first embodiment shown in FIGS. 1–7 having the crystallization preventing layer between the amorphous silicon films includes a few capacitors including a portion which has no concave/convex in the form of hemi-spherical grains HSG, per 500 capacitors, but includes no capacitors including no concave/convex in the form of hemi-spherical grains HSG. The second embodiment shown in FIGS. 8-9 includes neither a capacitor including a portion which has no concave/convex in the form of hemi-spherical grains HSG, nor a capacitor including no concave/convex in the form of hemi-spherical grains HSG.

As seen from the above, the capacitor lower plate in accordance with the present invention has a surface area which is at least 1.8 times that of a capacitor lower plate which is not processed to have hemi-spherical grains HSG, and is very low in fraction defective.

In the above mentioned embodiments, the first to third amorphous silicon films were formed by using silane (SiH4), but disilane (Si2H6), trisilane (Si3H8), or dichlorosilane (SiH2Cl2) can be used to form the first to third amorphous silicon films. In addition, in place of phosphorus, As (arsenic) or B (boron) can be introduced by using arsine (AsH3), borane (BH4), diborane (B2H6), or triborane (B3H8).

As mentioned above, the capacitor lower plate in the accordance with the present invention has concaves and convexes in the form of hemi-spherical grains HSG, uniformly formed on not only a top surface but also a side surface of the capacitor lower plate, with the result that a remarkably increased capacitance can be obtained. In addition, since the method in the accordance with the present invention for manufacturing the capacitor lower plate can prevent the crystalline growth from the interlayer insulator film, it is possible to remarkably increase the capacitance in comparison with a capacitor having a capacitor lower plate manufactured in accordance with the prior art process for the purpose of forming concaves and convexes in the form of hemi-spherical grains HSG, on not only a top surface but also a side surface of the capacitor lower plate, and in addition, the fraction defective can be greatly improved.

The invention has thus been shown and described with reference to the specific embodiments. However, it should be noted that the present invention is in no way limited to the details of the illustrated structures but changes and modifications may be made within the scope of the appended claims.

We claim:

1. A capacitor incorporated in a semiconductor device and having a capacitor lower plate having a top surface and a side surface continuous to the top surface, said capacitor lower plate being composed of a first silicon film, a crystallization preventing layer formed on the first silicon film, and a second silicon film formed on the crystallization preventing layer, said capacitor lower plate having concaves and convexes in the form of hemi-spherical grains formed on said top surface and said side surface, said capacitor lower plate being covered with a capacitor insulating film which is covered with a capacitor upper plate.

2. A capacitor claimed in claim 1 wherein said capacitor lower plate has a connection extending at a side opposite to said top surface.

3. A capacitor claimed in claim 1 wherein each of said first and second silicon films is formed of polysilicon or amorphous silicon.

4. A capacitor claimed in claim 3 wherein each of said first and second silicon films contains impurity.

5. A capacitor claimed in claim 1 wherein said second silicon film has an impurity concentration higher than that of said first silicon film.

6. A capacitor incorporated in a semiconductor device and having a capacitor lower plate having a top surface region and connected to another circuit element formed in the semiconductor device, said capacitor lower plate having an impurity concentration grade which is low at a lower portion adjacent to the circuit element and which is high at said top surface region, said capacitor lower plate including a first silicon film having a low impurity concentration and consituting said lower portion and a second film formed on said first silicon film having an impurity concentration higher than that of said first silicon film, said capacitor lower plate having concaves and convexes in the form of hemi-spherical grains formed on at least said top surfaces, said capacitor lower plate being covered with an insulating film which is covered with a capacitor upper plate.

7. A capacitor claimed in claim 6 wherein said capacitor lower plate has a side surface continuous to said top surface, and said concaves and convexes in the form of hemi-spherical grains are formed on not only said top surface but also said side surface.

8. A capacitor claimed in claim 7 wherein each of said first and second silicon films is formed of impurity-containing polysilicon or amorphous silicon.

9. A capacitor claimed in claim 6 wherein each of said first and second silicon films is formed of impurity-containing polysilicon or amorphous silicon.

* * * * *